United States Patent [19]

Boeke

[11] Patent Number: 4,980,964
[45] Date of Patent: Jan. 1, 1991

[54] SUPERCONDUCTING WIRE

[76] Inventor: Jan Boeke, P.O. Box 2327, Chapel Hill, N.C. 27514

[21] Appl. No.: 234,271

[22] Filed: Aug. 19, 1988

[51] Int. Cl.$^5$ ............................................. H01B 12/00
[52] U.S. Cl. .................................... 29/599; 174/125.1;
505/887; 505/918
[58] Field of Search ........................ 174/125.1; 29/599;
505/887, 884, 918, 1

[56] References Cited

U.S. PATENT DOCUMENTS

| | | | |
|---|---|---|---|
| 3,619,479 | 11/1971 | Bogner | 174/125.1 |
| 4,044,457 | 8/1977 | Strauss et al. | 505/918 X |
| 4,558,512 | 12/1985 | Chaussy et al. | 174/125.1 X |
| 4,762,754 | 8/1988 | Nellis et al. | 428/552 |

FOREIGN PATENT DOCUMENTS

| | | | |
|---|---|---|---|
| 281474 | 9/1988 | European Pat. Off. | 29/599 |
| 285169 | 10/1988 | European Pat. Off. | 29/599 |
| 2519230 | 11/1976 | Fed. Rep. of Germany | 174/125.1 |
| 2142256 | 1/1973 | France | 174/125.1 |
| 165206 | 12/1981 | Japan | 174/125.1 |
| 10526 | 2/1982 | Japan | 174/125.1 |

OTHER PUBLICATIONS

Okada, M. et al., Fabrications of Ag-Sheathed Ba-Y-Cu Oxide Superconductor Tape; Japanese J. of Appl. Phys; vol. 27, No. 2, Feb. 88.
Ohmatsu, K. et al., Superconducting Wires of High $T_c$ Oxides, Japanese Journal of Applied Physics, vol. 26 (1987), Supplement 26-3.
Sadaka, N. et al., Fabrication and Superconducting Properties of High Tc Oxide Wire; Mat. Res. Soc. Symp. Proc. vol. 99, 1988 Materials Research Society; Symposium Held 11-12/87.
Yamada, Y. et al., Bulk and Wire Type Y-Ba-Cu Oxide Superconductor; Japanese Journal of Applied Physics, vol. 26 (1980), Supplement 263.
S. Jin et al., "High $T_c$ Superconductors—Composite Wire Fabrication", Appl. Phys. Lett., vol. 51(3), pp. 203-204 (1987).
D. W. Murphy et al., "Processing Techniques for the 93K Superconductor $Ba_2YCu_3O_7$", Science, vol. 241, pp. 922-926 (1988).
Maeda et al., A New High Tc Oxide Superconductor Without a Rare Earth Element; Jap. J. Appl. Phys. 27, L209-L210 (2/1988).
Subramanian et al., A New High Temperature Superconductor: $Bi_2SR_{3-x}Ca_xCu_2O_{8+y}$; Science, 239, 1015-1017 (2/1988).
Subramanian et al., Crystal Structure of the High-Temperature Superconductor $Tl_2Ba_CCa_aCuO_8$; Nature, 332, 420-422 (3/1988).
Research and Development Jul. 1988, "Researchers Produce Large-Current Superconductor Wire".

Primary Examiner—Morris H. Nimmo
Attorney, Agent, or Firm—Connolly and Hutz

[57] ABSTRACT

A wire of ceramic superconductive material is produced by filling a metal tube with a powder of superconductive material, sealing the tube ends and drawing the filled, sealed tube through dies of progressively smaller size until a predetermined wire size is achieved and then heat treating the drawn wire to assure necessary crystallinity in the superconductor material.

13 Claims, 2 Drawing Sheets

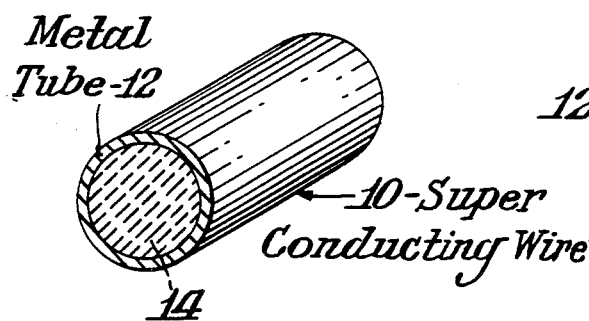
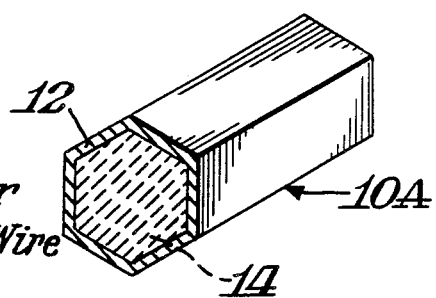
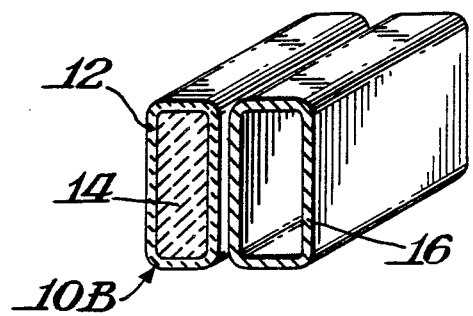
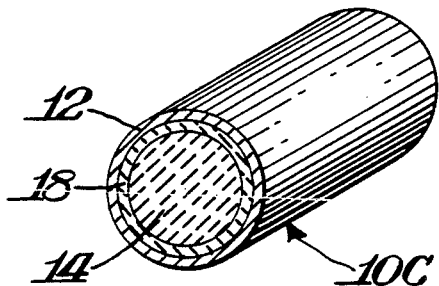

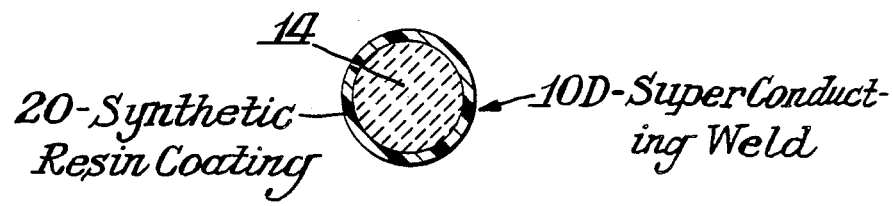
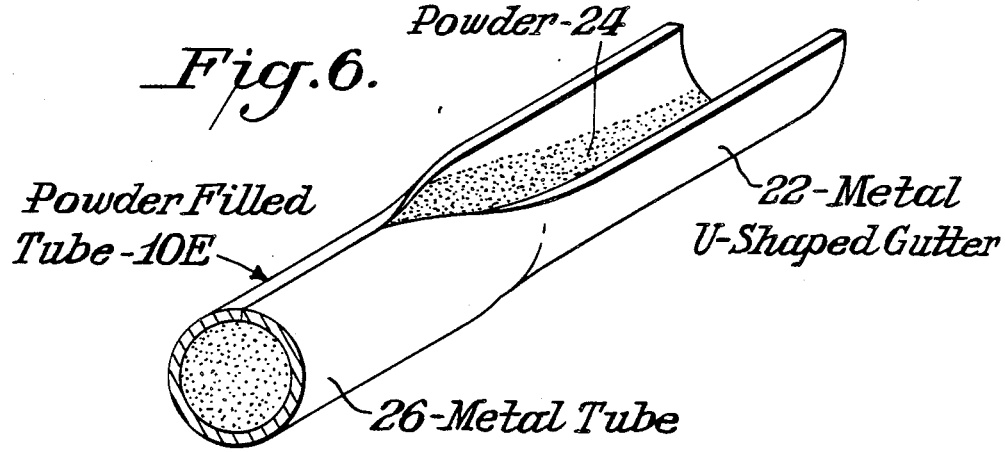
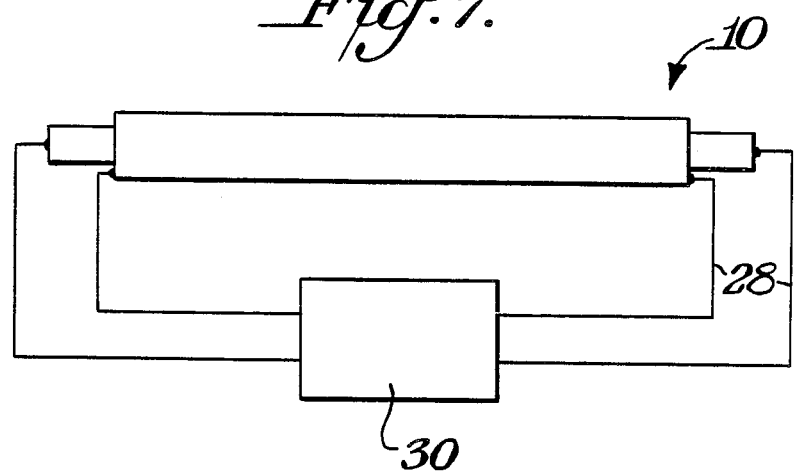

SUPERCONDUCTING WIRE

The present invention relates to a wire or cable which is superconductive to electrical currents and a method of its manufacture.

BACKGROUND OF THE INVENTION

Wires and cables used for conducting electricity are made of conducting metal with a wide variety of diameters and cross-sectional profiles. The wire may be surrounded by one or more layers of nonconducting material as insulation, and the insulation may again be surrounded by a shield of woven or solid metal. This again may be surrounded by a protective coating of rubber or polymers. Such an assembly of layers around multiple strands of wire is usually called a cable.

A specialized kind of wire conductor is used as the heating element in kitchen ranges and ovens. A metal conductor, usually made of a higher-resistivity alloy with a high melting point, is enclosed in a hollow tube of a high-temperature and corrosion-resistant alloy. The space between wire and tube is filled with a powdered fire-resistant material such as magnesium oxide which at all temperatures of use is a non-conductor of electricity. Such assembly is sealed at the ends and then drawn through a die of a desired size and configuration, causing the tube and its contents to become thinner and longer. The drawing action is repeated until the tube has been reduced to the desired diameter and cross-sectional profile. The result is a stiff "shielded" wire where the central conducting wire is embedded in a highly compacted insulator and the whole assembly is protected by an external metal shell. Pieces of this wire can be cut and bent into a desired shape. At the ends the conducting core can be connected to current-carrying contacts in order to complete an electric circuit.

It has long been known that at sufficiently low temperatures certain materials become superconductors of electric currents by virtue of extremely low (or absence of) electrical resistance. Much research work is being directed to finding materials which will be superconducting at temperatures above the atmospheric boiling point of liquid nitrogen. So far, these materials have been found to be ceramic type materials. A ceramic is a composition of metallic elements and oxygen which is hard and brittle. Such materials are more fully described in the following publications:

(1) Maeda et al., *Jap. J. Appl. Phys.* 27, L209-L210 (1988), describing the $Bi_2$-Sr-Ca-Cu system;
(2) Subramanian et al., *Science,* 239,1015–1017 (1988), describing the crystal structure of the above system;
(3) Subramanian et al., *Nature,* 332, 420–422 (1988) describing the structure of a Tl-system.

In transmitting electrical energy, a superconductor would be most useful in the form of a wire or cable. However, due to the hard and brittle nature of ceramic materials, the ceramic superconductors do not naturally lend themselves easily to such applications. This is confirmed by a new note entitled "Researchers Produce Large-Current Superconductor Wire" in the July, 1988 issue of *Research & Development* wherein superconducting fibers are reported to have been pulled from a melt. Such fibers are said to require a temperature of 4° K. and are quite small as indicated by the current capacity of 30,000 $A/cm^2$.

Accordingly, it is an object of the present invention to provide a means whereby superconductor materials can be formed into a wire or cable. It is a further object of this invention to provide a means for protecting the superconducting wire from damage when the superconducting property is interrupted or lost.

BRIEF DESCRIPTION OF THE INVENTION

To obtain a wire of superconducting material according to the present invention, a tube of suitable metal or alloy is capped at one end with highly conductive metal or alloy and the tube is filled with powdered ceramic superconductor material or material which will become a superconductor. The filled tube is then closed with a cap of highly conductive metal or alloy. The tube with its contents is then drawn through dies of succeeding smaller diameter and of a desirable hole profile until a thinner wire of desired cross-sectional dimensions is obtained. When the desired wire diameter is obtained, the wire is heated to a temperature required to give the ceramic superconductor the desired crystal characteristics.

To protect the wire from superheating when the superconductive characteristics disappear, a cutout relay can be connected between the end caps of the wire to cause cutoff of the voltage over the wire if that voltage rises to exceed a predetermined value.

BRIEF DESCRIPTION OF THE DRAWING

FIG. 1 illustrates a cross-section of a circular wire embodiment of this invention;

FIG. 2 illustrates a cross-section of a hexagonal wire embodiment of this invention;

FIG. 3 illustrates a cross-section of a rectangular wire embodiment of this invention which also includes an associated parallel cooling tube;

FIG. 4 illustrates a cross-section of a wire embodiment of this invention wherein the superconducting wire is surrounded by a glass insulator;

FIG. 5 illustrates a resin coated wire embodiment of this invention;

FIG. 6 illustrates a U-shaped gutter with powdered superconductor material being closed into a tube filled with superconductor material;

FIG. 7 illustrates a wiring diagram showing connection of a current sensing and interruption means 30.

DETAILED DESCRIPTION

In one embodiment of the present invention a relatively thick-walled piece of metal tubing (such as, for example, tubing of copper, iron or an alloy selected for its particular characteristics) is closed off at one end with a cap of a highly conductive metal such as copper or silver. Then the capped tubing is filled with a superconducting material in a powder form. To assure a complete filling, the powder may be compacted in the tube. When the tube is full, the open end is capped with highly conductive metal.

The superconductor powder used to fill the tube can be any powder of a material which has or can be given superconductivity properties. Any superconductor material can be used for the present invention. The presently best superconductors are ceramic-type materials. The differences between these new ceramic superconductors and the previously known metallic superconductors is that when these ceramics are cooled, they will become superconductive at temperatures above the temperature of boiling liquid nitrogen, i.e., 77° Kelvin or −196° C. Whereas the older superconductors needed cooling for at least 70 additional degrees with liquid helium. Considering the difference in price and availability of liquid nitrogen versus liquid helium, this is considered to be an enormous improvement.

Therefore, particular interest has developed in ceramic superconductor materials which have superconductive properties above the boiling temperature of liquid nitrogen, i.e., above about 77° K. For example, three ceramic systems are presently known to be superconductive. Those are the Y-Ba-Cu-O system, the Bismuth Group and the Thallium Group.

The Y-Ba-Cu-O system (also known as the "1-2-3-group") contains oxides of one gram atom of yttrium, two gram atoms of barium and three gram atoms of copper. Compositions of this system become superconductive at about 95° K.

The Bismuth Group contains oxides of one gram atom of calcium, one or two gram atoms of barium, one or two gram atoms of bismuth, and two gram atoms of copper. Members of this group become superconductive at about 110° K.

The Thallium group contains oxides of two gram atoms of thallium, two gram atoms of calcium, two gram atoms of barium and three gram atoms of copper. These materials become superconductive at about 125° C.

All these ceramic superconductors suffer from the same drawback; i.e., they cannot be formed into wires. The present invention presents a solution to that shortcoming of ceramic superconductors.

To convert the capped, superconductor-filled tube into a wire form, the piece of tubing between the caps, or the whole assembly of tubing, is drawn through a die with an opening slightly smaller than the diameter of the tubing. The opening may be circular or may have some other predetermined shape. To soften the metal of the tubing an appropriate heat treatment can be applied and the tubing again drawn through a die with a smaller opening. These operations may be repeated until the resulting wire has the desired cross-sectional diameter and shape.

The thickness of the outer metal layer and the size of the superconductor wire are determined by the dimensions of the starting tube and filling as well as the number of drawings and size reductions. The metal thickness is not critical and its dimensions are primarily dictated by the metal drawing strength and the mechanical strength necessary to support the superconductor wire. For example, copper would need to be thicker than iron. Of course, the size and configuration of the superconductor itself is also not critical and the final dimensions selected should be determined by the required current carrying demands. Generally, wires of 0.05 to 10 cm. are suitable and lengths are only limited by the drawing apparatus employed and the initial tube dimensions.

When the desired cross-section and shape are obtained, the wire-shaped filled tube is given a heat treatment which converts the powder filling to the desired crystalline habit for best superconductivity. If this habit is very brittle and if breaking the interconnected crystals of the fill results in less desirable characteristics, the wire may first be wound to form a desired spool and so heat-treated, or it may be drawn through a tubular furnace to form a straight wire or a wire which is wound on a large-diameter support. Or the wire may be heated by electrical resistance by sending a carefully controlled electrical current through the metallic shell or mantle to heat the wire assembly to the desired processing temperature. Normally, this heat treatment is in the range of 600°–900° C. or to the melting point of the superconductor material. Such heat treatments are known in the art for the purpose of imparting superconductive properties.

These embodiments of this invention are illustrated in the drawing. FIG. 1 and FIG. 2 show the wire of this invention 10 and 10A as having a cross-sectional configuration which is circular and hexagonal, respectively. In each of these two embodiments, superconductor 14 is encased by metal tube 12. FIG. 3 shows the wire of this invention 10B as having a rectangular cross-sectional configuration also shows superconductor 14 encased in metal tube 12 but further illustrates use of a parallel tube 16 which is hollow. Parallel tube 16 is mated with the superconducting wire assembly and when a cooling fluid such as liquid nitrogen or other suitable material fluid at low temperatures is pumped through tube 16, the temperature of the superconductor may be regulated and controlled. The hollow tube 16 can be larger or smaller than the wire 10B and can have the same or different cross-sectional configuration. The tube 16 can be arranged substantially parallel to the wire. Also, the hollow tube 16 can partially or completely surround the wire 10B.

Although only three cross-sectional configurations are illustrated, any desirable shapes can be formed. The configurations of FIG. 2 and 3 are especially suitable when a dense packing of several layers of superconductor wire are desired.

In another embodiment, which lends itself to continuous operation, an endless wire of any desired diameter can be produced. In this continuous process, a strip of the outer cladding metal or alloy of a suitable width is provided in a roll of a suitable length; if continuity of length is required, the beginning of another roll may be welded onto the end of the first roll. The metal strip is bent and curved between rollers into a cross-sectional u-shape to form a gutter. Superconductive powder or its precursor is poured into the gutter so formed and the gutter is drawn through an O-shaped opening, which opening may be shaped by rollers, or a die, and is formed into a closed tube. The initial part of the gutter is sealed with a conductive metal plug. The closed tube when so formed will have a seam which can be closed by continuous spot welding or brazing with an alloy having a melting point below the sintering temperature or crystallization temperature of the superconductor powder used, if this operation is deemed advantageous. By vibration the tube can be more fully filled solid with the powder. The tube so formed can be drawn through dies as described above for seamless tubing, to compact the powder and to form the tube to the desired cross-sectional shape and diameter.

A wider strip may be formed into tubing around the filled tube to conduct coolant around the superconducting wire. Or a hollow tube to conduct coolant may be mated with a superconducting wire, as described above in connection with FIG. 3.

The resulting superconducting wire assembly can then be laid, routed or hung in a desired pattern, and then heated by slowly passing a split tube furnace or a burner adjusted to the required temperature to properly crystallize the superconductive powder along the entire assembly. Such treatment may melt the solder in the seam of the superconducting wire but whether the seam is at this point soldered or not is of little consequence. If closure of the seam is necessary, another tube may be soldered around the assembly to close the seam.

In certain situations it may be desired to have a bare superconductor wire. Thus, a further embodiment of this invention is to remove the metal casing after the superconductor wire has been formed. Removal of the metal casing from the formed superconductor can be achieved by any suitable means such as, for example, by etching with a suitable chemical reagent which will dissolve the metal casing but leave the superconductor wire. If mechanical support or electrical insulation of the bare superconductor is desired, a coating of support and/or insulating material can then be applied. Suitable coatings include lacquers, synthetic resins and so forth.

When the metal selected for the tube material reacts unfavorably under processing conditions with the superconductor material filling the metal tube, it is desirable to plate or clad the tube interior with a protective material prior to filling the tube with superconductor material. Suitable protective material include noble metals such as gold and platinum as well as nonreactive metal alloys. Of course, the protective material should be sufficiently ductile to endure the wire-drawing process without breaking.

The present invention also provides a means for producing a superconductor wire having a non-metallic cladding of a supporting and/or insulating material such as glass. To obtain a glass-clad superconductor wire, a metal tube is lined with the desired glass cladding material and the lined tube is then filled with superconductor material. After die-drawing and heat treating to produce the superconductor wire are completed, the metal tubing material can be removed leaving a glass-clad superconductor wire.

FIG. 4 illustrates this embodiment of the invention shown in circular cross-sectional configuration wherein wire 10C comprises superconductor 14 surrounded by glass 18 and the glass encased superconductor is encased by metal tube 12.

One convenient method of providing such a non-metallic layer between the metal and superconductor comprises placing in the metal tube a retractable thin-walled cylinder with a diameter smaller than the metal tube. The cylinder is filled with ceramic superconductor powder and the space between the metal tube and the cylinder wall is filled with the desired non-metallic material, e.g., glass powder. The retractable cylinder can then be removed so that inside the metal tube ceramic superconductor powder is surrounded by the non-metallic powder without a separating solid material between them. The tube is then closed off, drawn and hot processed and the glass powder will sinter or melt together to form a glass tube around the superconducting core. If the metal shell is etched away, the superconducting core remains insulated by the glass mantle and neighboring windings of coil cannot touch each other with a resulting short circuit as could possibly happen with a bare superconducting wire.

When the superconductor wire of this invention is mounted in an electrical circuit for testing or for use, connections to the rest of the circuit are made by way of the highly conducting end caps which seal the tube ends. Larger end pieces of highly conductive metal may be joined onto the caps to insure sufficient electrical carrying capacity to the rest of the circuit of the very high density electrical currents for which superconductive wires may be used when the core material is brought to the superconductive state.

In the superconductive state of the core, very high electrical currents can be carried by the wire without causing an appreciable voltage drop between the ends of the superconducting wire. Hence practically no current flows through the metal shell. Thus the metal tube acts as protective insulation for the superconductor. But if for some reason superconductivity of the core is reduced or lost, the core becomes a relatively poor conductor and the voltage between the ends of the wire will increase to a high value in an effort to maintain the current through the wire. Such high voltage would cause a high current through the metal shell which might cause excessive heating and destroy the wire assembly. For this reason, a fast-acting cutout relay should be connected to both ends of the superconductor wire, electrically bridging the wire assembly. If an appreciable resistance arises and current begins to flow in the metal shell between the ends, this relay will immediately cut the connection of the wire with the rest of the electrical circuit and so prevent Joule-heating of the metal shell.

Having fully described the superconductive wire of the present invention, the following example serves to further illustrate a particular aspect of the invention without limitation thereupon.

EXAMPLE

A superconductor material is prepared by thoroughly mixing the following starting materials as chemically pure, fine powders:
152.3 grams of Thallic Oxide ($Tl_2O_3$)
37.4 grams of Calcium Oxide (CaO)
102.3 grams of Barium Oxide (BaO)
79.5 grams of Cupric Oxide (CuO)

The mixture is pressed into pellets or bars and wrapped in gold foil. The foil-wrapped mixture is then heated in a quartz tube under oxygen for one hour at 700° C., and then at 800° C. for two hours.

This resulting superconductor material is crushed and reduced to a fine powder.

A metal tube is prepared by machining a tube of soft, ductile, low-carbon steel with an outside diameter of 15 mm. and an inside diameter of 11 mm. and a length of about 30 cm. One end of the tube is plugged and capped with welded-on silver. The inside of the tube is gold-plated.

The metal tube is then filled with the fine superconductor powder with concurrent vibration and tamping to assure complete filling. Then a gold-plated silver plug is welded on the open end.

Then the tube is drawn through successively smaller round dies until the outside diameter is reduced to the desired dimension of about 5 mm and 270 cm long. Then the tube as a straight wire is heated by slowly pulling it through a tube furnace at 900° C. in an atmosphere of 97% nitrogen and 3% hydrogen to avoid oxidation of the steel, cooled and tested. The heat treatment sinters and crystallizes the core which now is brittle and should not be bent anymore. After cooling to liquid nitrogen temperature or lower, the assembly should not be warmed up again to room temperature as the difference in linear thermal coefficient of expansion between shell and core may form transverse cracks in the core which might impede conduction.

What is claimed is:
1. A method for producing a protected wire of crystalline superconducting material which comprises:

(a) providing a metal tube with a lining of protective material which is substantially inert to both the metal tube and the superconductive material with which the tube is to be filled, (b) sealing the tube at one end with an electrically conductive metal, filling the tube with a superconductive material, and sealing the other end of the tube with an electrically conductive metal, (c) drawing at least a portion of the filled tube through at least one size-reducing die whereby the diameter of the tube and its contents is reduced to a wire size, and (d) heat treating the drawn wire to provide crystallinity in the superconductive material.

2. A method according to claim 1 wherein the hollow metal tube is lined with a glass powder before being filled with the superconductor material.

3. A method according to claim 2 wherein the heat treatment (d) fuses the glass powder particles into a unitary mass and after the heat treatment, removing the metal tube from the drawn wire.

4. A method according to claim 1 wherein after the heat treatment (d), removing the metal tube from the drawn wire.

5. A method according to claim 4 wherein the metal tube removal is by chemical etching.

6. A method according to claim 4 wherein after removal of the metal tube, the superconductor wire with coating support material which is a synthetic resin.

7. A method according to claim 1 wherein the cross-section of the drawn wire is square, rectangular, round or hexagonal.

8. A method according to claim 1 wherein the metal tube is iron and the lining of protective material is a noble metal.

9. A method for the continuous production of a superconductor wire which comprises:

(a) forming a trip of metal into a u-shaped gutter, (b) filling said gutter with a powder of a superconductor material, (c) sealing said gutter into a tube to surround and encase the superconductor material, (d) drawing the sealed gutter through at least one size reducing die to form a wire, and (e) heat treating the formed wire.

10. A method according to claim 9 wherein the hollow metal tube has an interior surface coating of a protective material which is substantially inert to both the metal tube and the superconductive material.

11. A method according to claim 9 wherein the cross-section of the drawn wire is square, rectangular, round or hexagonal.

12. A method according to claim 9 wherein after the heat treatment (e), removing the metal tube from the drawn wire.

13. A method according to claim 12 wherein the metal tube removal is by chemical etching.

* * * * *

REEXAMINATION CERTIFICATE (1924th)

United States Patent [19]
Boeke

[11] B1 4,980,964
[45] Certificate Issued Feb. 9, 1993

[54] SUPERCONDUCTING WIRE

[76] Inventor: Jan Boeke, P.O. Box 2327, Chapel Hill, N.C. 27514

Reexamination Request:
No. 90/002,350, May 22, 1991

Reexamination Certificate for:
Patent No.: 4,980,964
Issued: Jan. 1, 1991
Appl. No.: 234,271
Filed: Aug. 19, 1988

[51] Int. Cl.$^5$ ............................................. H01B 12/00
[52] U.S. Cl. ................................. 29/599; 174/125.1; 505/1; 505/887; 505/918
[58] Field of Search ................ 174/125.1; 29/599; 505/887, 884, 918, 1

[56] References Cited

U.S. PATENT DOCUMENTS

| | | | |
|---|---|---|---|
| 2,186,442 | 1/1940 | Youmans | 174/122 G |
| 2,207,579 | 7/1940 | Carl | 174/122 G |
| 3,619,479 | 11/1971 | Bogner | 174/125.1 |
| 3,758,701 | 9/1973 | Schmidt | 174/28 |
| 4,044,457 | 8/1977 | Strauss et al. | 505/918 X |
| 4,558,512 | 12/1985 | Chaussy et al. | 174/125.1 X |
| 4,762,754 | 8/1988 | Nellis et al. | 428/552 |
| 4,885,273 | 12/1989 | Sugimoto et al. | 505/1 |
| 4,906,609 | 3/1990 | Yamauchi et al. | 505/1 |
| 4,952,554 | 8/1990 | Jin et al. | 174/125.1 X |
| 5,043,320 | 8/1991 | Meyer et al. | 29/599 X |
| 5,087,604 | 2/1992 | Shiga et al. | 29/599 X |
| 5,100,865 | 3/1992 | Yamamoto et al. | 29/599 X |

FOREIGN PATENT DOCUMENTS

| | | | |
|---|---|---|---|
| 281474 | 9/1988 | European Pat. Off. | 29/599 |
| 285169 | 10/1988 | European Pat. Off. | 29/599 |
| 2519230 | 11/1976 | Fed. Rep. of Germany | 174/125.1 |
| 2142256 | 1/1973 | France | 174/125.1 |
| 165206 | 12/1981 | Japan | 174/125.1 |
| 10526 | 2/1982 | Japan | 174/125.1 |

OTHER PUBLICATIONS

Okada, M. et al.; Fabrication of Ag-Sheathed Ba-Y-Cu Oxide Superconductive Tape; Japanese J. of Appl. Phys; vol. 27, No. 2, Feb. 88.

Ohmatsu, K. et al.; Superconducting Wires of High TC Oxides; Japanese Journal of Appl. Phys., vol. 26 (1987), Supplements 26-3.

Sadaka, N. et al.; Fabrication and Superconducting Properties of High Tc Oxide Wire; Mat. Res. Soc. Syump. Proc., vol 99, 1988; Materials Research Society; Symposium Held Nov. 12, 1987.

Yamada, Y. et al.; Bulk and Wire Type Y-Ba-Cu-Oxide Superconductor; Japanese Journal of Appl. Phys., vol. 26 (1987), Supplement 26-3.

Jin, S. et al.; "High Tc Superconductors-Composite Wire Fabrication", Appl. Phys. Letter, vol. 51 (3), pp. 203-204 (1987).

Murphy, D. W. et al.; "Processing Techniques for the 93K Superconductor $Ba_2YCU_3O_7$", Science, vol. 241, pp. 922-926 (1988).

Research and Development; Jul. 1988; "Researchers Produce Large-Current Superconductor Wire".

Maeda et al.; "A New High Tc Oxide Superconduct Without a Rare Earth Element"; Jap. J. Appl. Phys. 27, L209-L210 (Feb. 1988).

Subramanian et al.; "A New High-Temperature Superconductor; $Bi_2Sr_{3-x}Ca_xCu_2O_{8+y}$"; Science, 239, 1015-1017 (Feb. 1988).

Subramamian et al.; Crystal Structure of the High-Temperature Superconductor $Tl_2B_aC_aC_uO_8$; Nature, 332, 420-422 (Mar. 1988).

Murphy, D. W. et al.; "New Superconducting Cuprate Perovskites; *The American Physcial Society; Physical Review Letters*"; 4 May 1987; pp. 1888-1890.

"Critical Current Density of Wire Type Y-BA-CU Oxide Superconductor", Yamada et al., Japanese Journal of Applied Physics, May 1987.

*Primary Examiner*—Morris H. Nimmo

[57] ABSTRACT

A wire of ceramic superconductive material is produced by filling a metal tube with a powder of superconductive material, sealing the tube ends and drawing the filled, sealed tube through dies of progressively smaller size until a predetermined wire size is achieved and then heat treating the drawn wire to assure necessary crystallinity in the superconductor material.

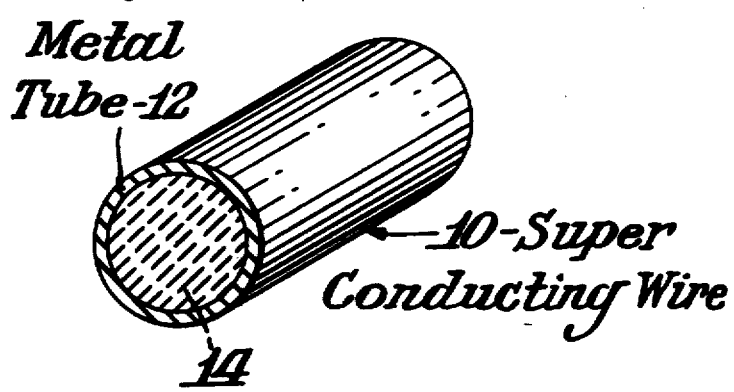

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 2 is cancelled.

Claims 1, 3, 8 and 9 are determined to be patentable as amended.

Claims 4-7 and 10-13, dependent on an amended claim, are determined to be patentable.

New claim 14 is added and determined to be patentable.

1. A method for producing a protected wire of crystalline superconducting material which comprises:
    (a) providing a metal tube with a lining of protective [material] *glass powder* which is substantially inert to both the metal tube and the superconductive material with which the tube is to be filled,
    (b) sealing the tube at one end with an electrically conductive metal, filling the tube with a superconductive material, and sealing the other end of the tube with an electrically conductive metal,
    (c) drawing at least a portion of the filled tube through at least one size-reducing die whereby the diameter of the tube and its contents is reduced to a wire size, and
    (d) heat treating the drawn wire to provide crystallinity in the superconductive material.

3. A method according to claim [2] *1* wherein the heat treatment (d) fuses the glass powder particles into a unitary mass and after the heat treatment, removing the metal tube from the drawn wire.

8. A method according to claim 1 wherein the metal tube is iron [and the lining of protective material is a noble metal].

9. A method for the continuous production of a superconductor wire which comprises:
    (a) forming a [trip] *strip* of metal into a u-shaped gutter, *said metal being a soft, ductile, low-carbon steel,*
    (b) filling said gutter with a powder of a superconductor material,
    (c) sealing said gutter into a tube to surround and encase the superconductor material,
    (d) drawing the sealed gutter through at least one size reducing die to form a wire, and
    (e) heat treating the formed wire.

*14. A method for producing a protected wire of crystalline superconducting material which comprises:*
    *(a) providing a metal tube of a soft, ductile, low-carbon steel with a lining of protective material which is substantially inert to both the metal tube and the superconductive material with which the tube is to be filled,*
    *(b) sealing the tube at one end with an electrically conductive metal, filling the tube with a superconductive material, and sealing the other end of the tube with an electrically conductive metal,*
    *(c) drawing at least a portion of the filled tube through at least one size-reducing die whereby the diameter of the tube and its contents is reduced to a wire size, and*
    *(d) heat treating the drawn wire to provide crystallinity in the superconductive material.*

* * * * *